(12) United States Patent
Kim et al.

(10) Patent No.: US 6,982,487 B2
(45) Date of Patent: Jan. 3, 2006

(54) WAFER LEVEL PACKAGE AND MULTI-PACKAGE STACK

(75) Inventors: Hyeong-Seob Kim, Cheonan (KR); Tae-Gyeong Chung, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 4 days.

(21) Appl. No.: 10/665,630

(22) Filed: Sep. 22, 2003

(65) Prior Publication Data

US 2004/0188837 A1 Sep. 30, 2004

(30) Foreign Application Priority Data

Mar. 25, 2003 (KR) .................. 10-2003-0018446

(51) Int. Cl.
*H01L 23/48* (2006.01)
(52) U.S. Cl. .................. 257/774; 257/621; 257/673; 257/693; 257/737; 257/738; 257/773
(58) Field of Classification Search .......... 257/448, 257/457, 459, 503, 573, 587, 602, 621, 673, 257/688, 689, 692–697, 735–739, 773–776, 257/780–786
See application file for complete search history.

(56) References Cited

U.S. PATENT DOCUMENTS

| | | | | | |
|---|---|---|---|---|---|
| 4,700,276 A | * | 10/1987 | Freyman et al. | ............ | 361/771 |
| 4,700,473 A | * | 10/1987 | Freyman et al. | ............... | 29/846 |
| 5,046,238 A | * | 9/1991 | Daigle et al. | ................. | 29/830 |

(Continued)

FOREIGN PATENT DOCUMENTS

JP 8-213427 8/1996

(Continued)

*Primary Examiner*—Andy Huynh
(74) *Attorney, Agent, or Firm*—Volentine Francos & Whitt, PLLC

(57) ABSTRACT

A semiconductor chip package includes a semiconductor chip having a through hole extending there through from an active first surface to an inactive second surface. A first conductive pad at least partially surrounds the through hole on the active first surface of the semiconductor chip. The package also includes a printed circuit board having a first surface attached to the inactive second surface of the semiconductor chip, and a second conductive pad aligned with the through hole of the semiconductor chip. A conductive material fills the through hole and contacts the first and second conductive pads.

35 Claims, 19 Drawing Sheets

U.S. PATENT DOCUMENTS

| | | |
|---|---|---|
| 5,202,754 A | 4/1993 | Bertin et al. |
| 5,229,647 A | 7/1993 | Gnadinger |
| 5,877,034 A | 3/1999 | Ramm et al. |
| 5,973,396 A | 10/1999 | Farnworth |
| 6,087,719 A | 7/2000 | Tsunashima |
| 6,168,969 B1 | 1/2001 | Farnworth |
| 6,392,292 B1 | 5/2002 | Morishita |
| 6,400,008 B1 | 6/2002 | Farnworth |
| 6,429,096 B1 * | 8/2002 | Yanagida .................... 438/459 |
| 6,444,576 B1 | 9/2002 | Kong |
| 6,448,661 B1 | 9/2002 | Kim et al. |
| 6,459,150 B1 * | 10/2002 | Wu et al. .................... 257/724 |
| 6,735,857 B2 * | 5/2004 | Saito et al. .................... 29/840 |
| 6,809,421 B1 * | 10/2004 | Hayasaka et al. ........... 257/777 |
| 2002/0110953 A1 | 8/2002 | Ahn et al. |

FOREIGN PATENT DOCUMENTS

| | | |
|---|---|---|
| JP | 9-307013 | 11/1997 |
| JP | 11-163521 | 6/1999 |
| JP | 2000-49277 | 2/2000 |
| JP | 2001-135776 | 5/2001 |
| JP | 2001-148457 | 5/2001 |
| JP | 2002-26240 | 1/2002 |
| JP | 2002-76247 | 3/2002 |
| JP | 2002-118198 | 4/2002 |
| KR | 1999-003745 | 1/1999 |

\* cited by examiner

WAFER LEVEL PACKAGE AND MULTI-PACKAGE STACK

BACKGROUND OF THE INVENTION

1. Field of the Invention

The present invention generally relates to the packaging of semiconductor chips. More particularly, the present invention relates to wafer level packages, multi-package stacks of wafer level packages, and methods of manufacturing wafer level packages and multi-package stacks.

2. Background of the Invention

The miniaturization of electronic devices has led to the development of different techniques for containing semiconductor integrated circuit (IC) chips in smaller and smaller packages. The Joint Electronic Device Engineering Council (JEDEC) has proposed the name "Chip Scale Package (CSP)" to denote a semiconductor chip package which is nearly as small as the semiconductor chip itself. In particular, the JEDEC defines CSP as a package having an outline that is 1.2 times or less the outline of the semiconductor chip contained in the package. CSP technology is suitable for packaging ICs used in electronic products such as digital camcorders, notebook computers and memory cards. Specifically, major applications of CSP technology include digital signal processors (DSPs), microprocessors, application specific integrated circuit (ASICs), dynamic random access memories (DRAMs), and flash memories.

One disadvantage of CSP technology, however, is that the packages are relatively expensive to manufacture, especially when compared to more conventional and commonly used plastic packages, such as a ball grid array (BGA) package and a thin small outline package (TSOP).

In an effort to reduce costs, wafer level package (WLP) technology has been proposed. Wafer level packages are formed at the wafer level (thus reducing costs), and then diced into individual devices. The packages themselves are characterized by external terminals, such as metallic solder bumps or balls, that are distributed in a two-dimensional array over a bottom surface of the package. This reduces the signal path of the semiconductor chip to a package I/O location, thereby improving the operational speed of the device. Further, unlike other chip packages having peripheral leads extending from the sides of the package, the WLP occupies no more of the surface of the printed circuit board (PCB) than roughly the size of the chip itself.

FIG. 1 is a plan view illustrating a portion of a conventional WLP 20, and FIG. 2 is a cross-sectional view taken along the line I–I' of FIG. 1. A semiconductor integrated circuit chip 14 includes a plurality of chip pads 11 and a passivation layer 13 on a semiconductor substrate 12. The passivation layer 13 is formed of silicon oxide, silicon nitride or a composite layer thereof. The chip pads 11 are formed of aluminum. A first dielectric layer 22 of polyimide is formed on the semiconductor chip 14. A plurality of metal trace patterns 21 is formed on the first dielectric layer 22. Each of the metal trace patterns 21 contacts a corresponding one of the chip pads 11. A second dielectric layer 24 is formed on the metal trace patterns 21 and the first dielectric layer 22. The metal trace patterns 21, the first dielectric layer 22 and the second dielectric layer 24 constitute a rerouting layer 21'. A plurality of solder balls 28 are placed on the other end of the metal trace patterns 21. Subsequently, the resultant structure is subjected to a reflow process to join the solder balls 28 onto the metal trace patterns 21.

Unfortunately, however, the solder ball joints tend to be unreliable. A primary reason for this is the stresses that result from the difference in coefficients of thermal expansion (CTEs) of the WLP 20 and an external printed circuit board (PCB). That is, typically the WLP is mounted to a PCB such that the solder balls of the WLP are connected between the WLP and the PCB. The semiconductor chip 14 heats up when electrical power is dissipated during operation, and then cools down when not operating. The different rates of expansion of the WLP and PCB connected at opposite sides of the solder balls create mechanical stresses within the solder balls, sometimes resulting in fissures and other defects.

In the meantime, recent proposals include the stacking of plural wafer level packages to form a multi-package stack for mounting on a single printed circuit board.

For example, U.S. Pat. No. 6,429,096 is directed to a conventional method of forming a multi-package stack 10 as shown in FIG. 3. At the wafer level, apertures are formed through a semiconductor wafer, and the apertures are filled with conductive plugs 2. The semiconductor wafer is then diced and divided into a plurality of packages 1. At least two of the packages 1 are stacked through use of bumps 3 connected between the plugs 2 of adjacent packages, thereby forming the multi-package stack 10. The multi-package stack 10 is mounted on the landing pad 5 of an external PCB 4 through use of the bumps 3a at the bottommost package 1a.

Again, however, there is a difference in the coefficients of thermal expansion (CTEs) of the bottommost package 1a and an external printed circuit board (PCB). As a result, the joints formed by the solder balls 3a are unreliable and prone to failures.

SUMMARY OF THE INVENTION

According to one aspect of the present invention, a semiconductor chip package is provided which includes a semiconductor chip having a through hole extending there through from an active first surface to an inactive second surface. A first conductive pad at least partially surrounds the through hole on the active first surface of the semiconductor chip. The package also includes a printed circuit board having a first surface attached to the inactive second surface of the semiconductor chip, and a second conductive pad aligned with the through hole of the semiconductor chip. A conductive material fills the through hole and contacts the first and second conductive pads.

According to another aspect of the present invention, semiconductor multi-package stack is provided which includes a plurality of stacked semiconductor chip packages. Each chip package includes a semiconductor chip having a through hole extending there through from an active first surface to an inactive second surface. A first conductive pad at least partially surrounds the through hole on the active first surface of each semiconductor chip. Each package also includes a printed circuit board having a first surface attached to the inactive second surface of the semiconductor chip, and a second conductive pad aligned with the through hole of the semiconductor chip. A conductive material fills the through hole of each semiconductor chip and contacts the first and second conductive pads.

According to still another aspect of the present invention, a method for manufacturing a semiconductor chip package is provided which includes forming a through hole through a semiconductor chip such that the through hole extends from an active first surface of the semiconductor chip to an opposite inactive second surface of the semiconductor chip, and such that a first conductive pad at least partially surrounds the through hole on the first surface of the semiconductor chip. A first surface of a. printed circuit board is then attached to the second surface of the chip such that a second conductive pad of the printed circuit board is aligned with the through hole of the semiconductor chip. Then, the through hole is filled with a conductive material such that the conductive material contacts the first and second conductive pads.

According to yet another aspect of the present invention, a method of manufacturing a semiconductor chip package is provided which includes forming a plurality of through holes through a respective plurality of semiconductor chips contained in a wafer. The through holes extend from an active first surface of the wafer to an opposite inactive second surface of the wafer, and a first conductive pad at least partially surrounds each through hole on the first surface of the wafer. A plurality of second conductive pads are formed on a first surface a printed circuit board, and the first surface of a printed circuit board is attached to the second surface of the wafer such that the plurality of second conductive pads are respectively aligned with the plurality of through holes in the wafer. Then, the through holes are filled with a conductive material such that the conductive material contacts the first and second conductive pads of each through hole.

BRIEF DESCRIPTION OF THE DRAWINGS

The various aspects and features of the present invention will become readily apparent from the detailed description that follows, with reference to the accompanying drawings, in which.

DETAILED DESCRIPTION OF THE PREFERRED EMBODIMENTS

The present invention will be described in detail below by way of several non-limiting preferred embodiments.

Figure 1:
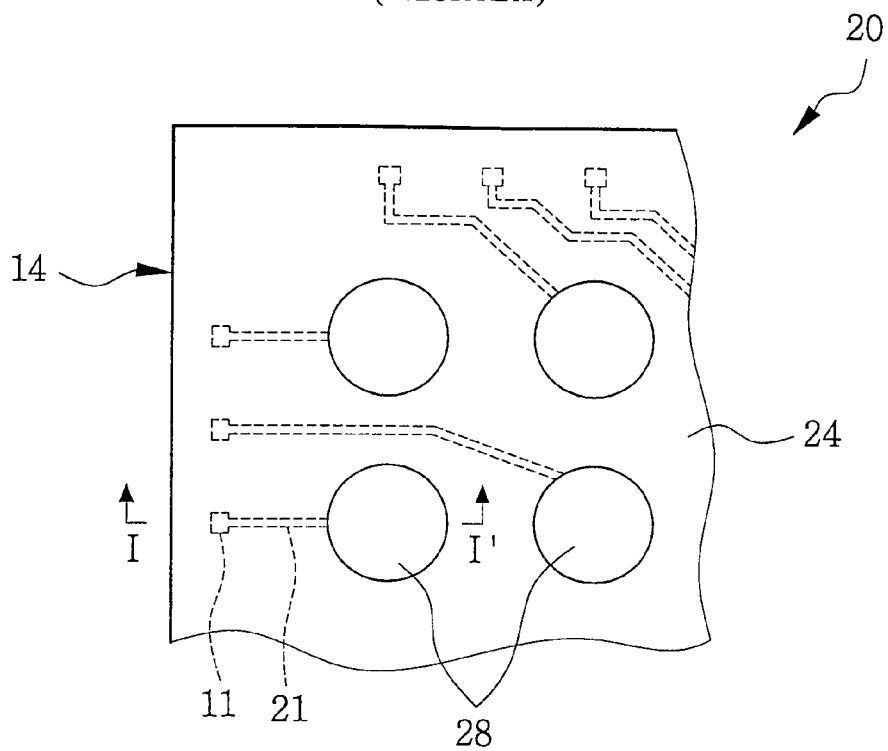
FIG. 1 is a plan view illustrating a portion of a conventional wafer level package.
Figure 2:
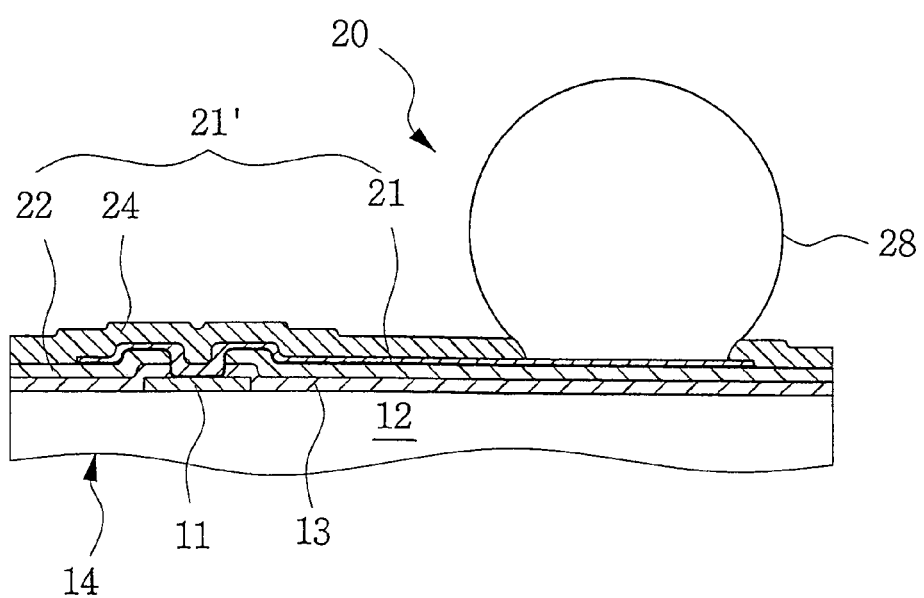
FIG. 2 is a schematic cross-sectional view taken along line I–I' of FIG. 1.
Figure 3:
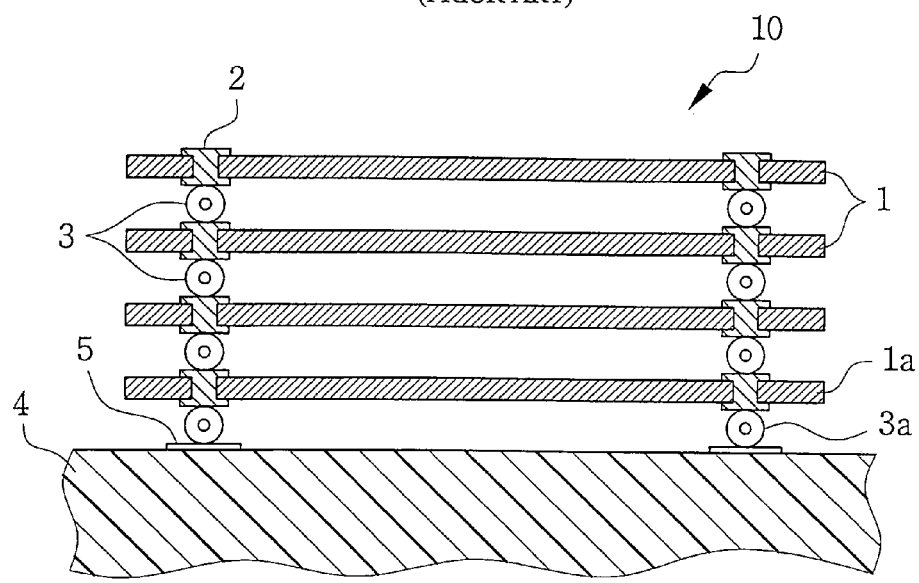
FIG. 3 is a schematic cross-sectional view of a conventional multi-package stack.
Figure 4:
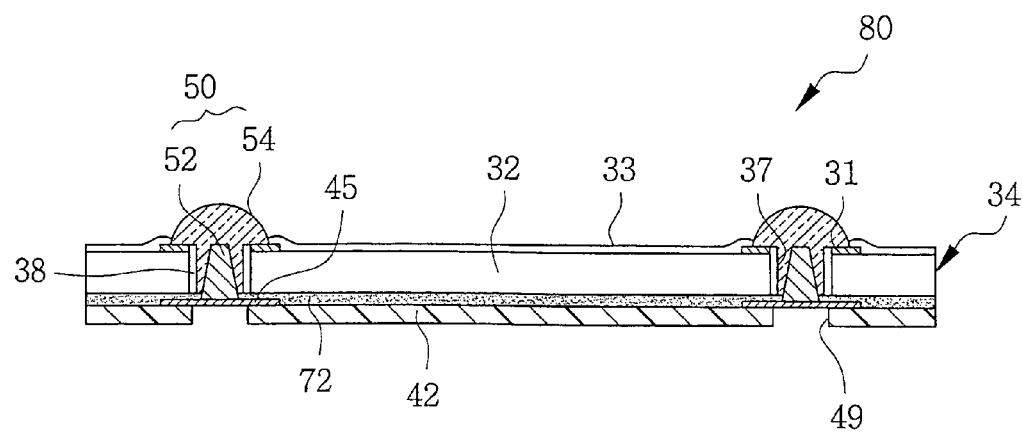
FIG. 4 is a schematic cross-sectional view of a wafer level package in accordance with an embodiment of the present invention.

FIG. 4 is a cross-sectional view of a wafer level package (WLP) 80 in accordance with an embodiment of the present invention. The WLP 80 includes a semiconductor chip 34 which is generally defined by a semiconductor substrate 32 having a passivation layer 33 on an active upper surface of the substrate 32. Examples of the passivation layer 33 include silicon oxide, silicon nitride, and composites thereof.

At least one through hole 37 is defined through the chip 34 from the active upper surface to an inactive lower surface of the chip 34. Also, a conductive chip pad 31 at least partially surrounds each through hole 37 on the active first surface of the semiconductor chip 34. For example, the conductive chip pad 31 may be formed of aluminum.

The WLP 80 also includes a printed circuit board (PCB) 42 having an upper surface attached to the inactive lower surface of the semiconductor chip 34. For example, the PCB 42 may be attached to the chip 34 by an adhesive 72. Further, the PCB 42 includes at least one conductive PCB pad 45 aligned with the respective through holes 37 of the semiconductor chip 34.

A conductive plug 50 fills each through hole 37 and contacts the conductive pads 31 and 45. In this manner, electrical contact is established between the chip pads 31 of the chip 34 and conductive PCB pads 45 of the PCB 42. Also, an insulating layer 38 may be formed on the sidewalls of the through holes 37 to isolate the conductive plugs 50 from the substrate 32.

Preferably, the conductive plug 50 is made of solder. More preferably, as shown in FIG. 4, the conductive plug 50 is defined by the combination of a metal PCB bump 52 which protrudes into the through hole from the conductive pad 45 of the PCB 42, and solder 54 which surrounds the PCB bump 52.

The printed circuit board 42 preferably includes an aperture 49 aligned below each conductive pad 45 on the opposite side of each through hole. The aperture 49 exposes a bottom surface of the conductive pad 45 and may be used in stacking the WLP 80 and/or in attaching the WLP 80 to an external printed circuit board as is described in later embodiments. For example, a solder ball (for external connection) may be connected to a bottom surface of the conductive PCB pad 45 so as to protrude downwardly through the aperture 49 from a lower surface of the PCB 42. Alternately, however, in the case where no aperture 49 is provided, a solder ball may be formed on the lower surface of the PCB 42 and electrically connected the PCB pad 45 through the PCB 42.

Reference is now made to FIGS. 5 through 16 which are diagrams for explaining successive process steps in the manufacture of the wafer level package 80 of FIG. 4.

Figure 5:
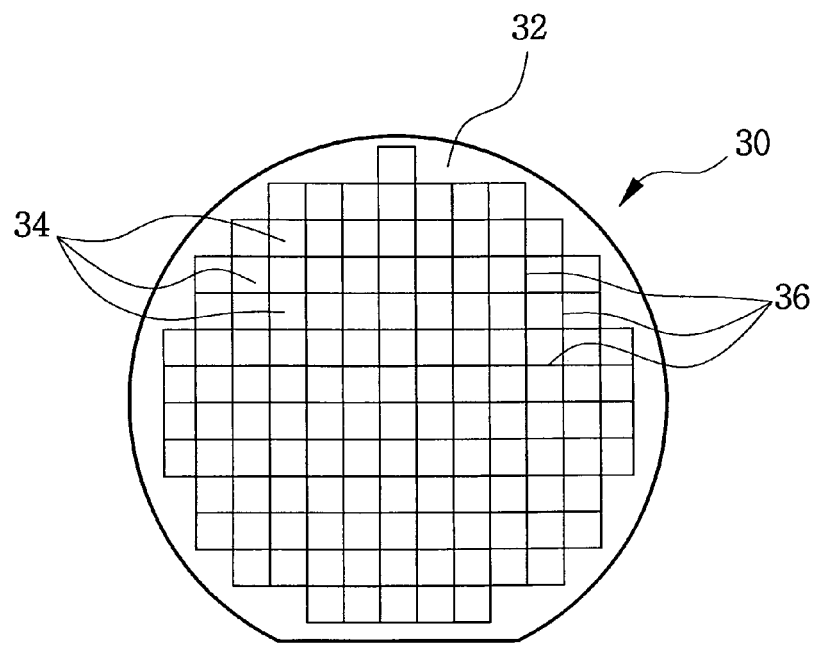
FIGS. 5 through 16 are diagrams for explaining successive process steps in the formation of the wafer level package of FIG. 4.

Referring first to FIG. 5, a silicon wafer 30 is provided which includes a semiconductor substrate 32 having a plurality of semiconductor integrated circuit chips 34. As shown, the chips 34 are separated from one another by chip scribe lines 36.

Figure 6:
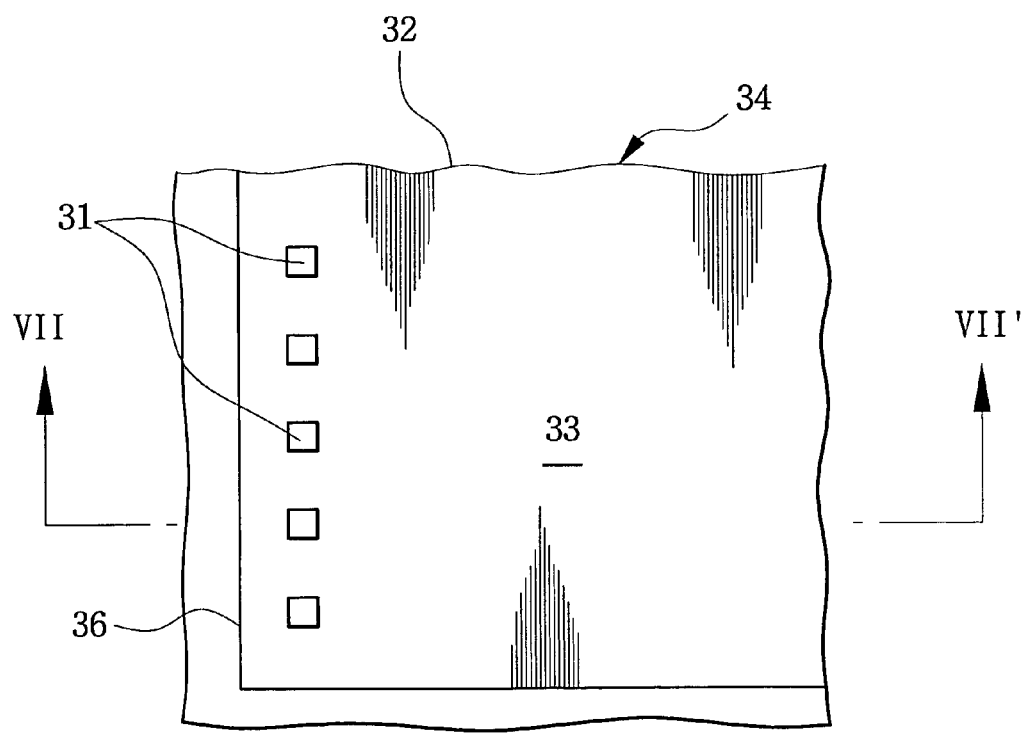
Figure 7:
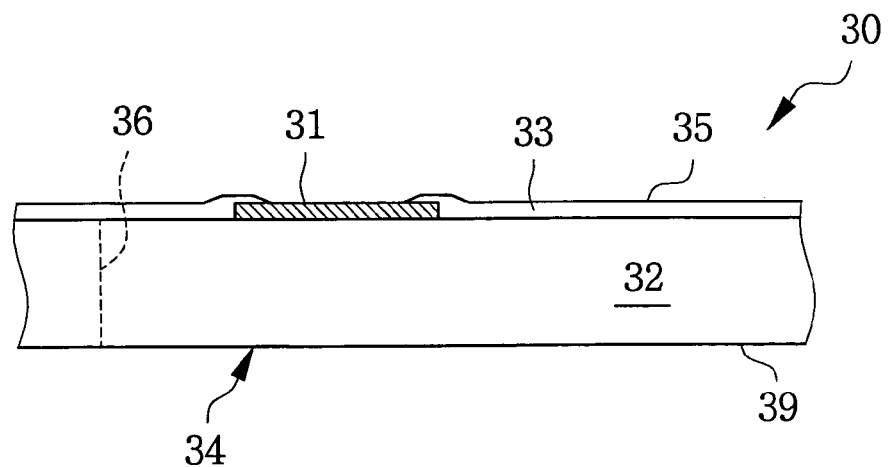

FIG. 6 shows a schematic top view of a portion of a chip 34 of the wafer 30 of FIG. 5, and FIG. 7 is a schematic cross-sectional view taken along line VII–VII' of FIG. 6. Each of the integrated circuit chips 34 includes a plurality of chip pads 31 and a passivation layer 33 on the semiconductor substrate 32. The passivation layer 33 includes openings which expose a portion of the surface of the chip pads 31. The passivation layer 33 may be formed of silicon oxide, silicon nitride or a composite thereof. The chip pads 31 may be formed of aluminum.

Figure 8:
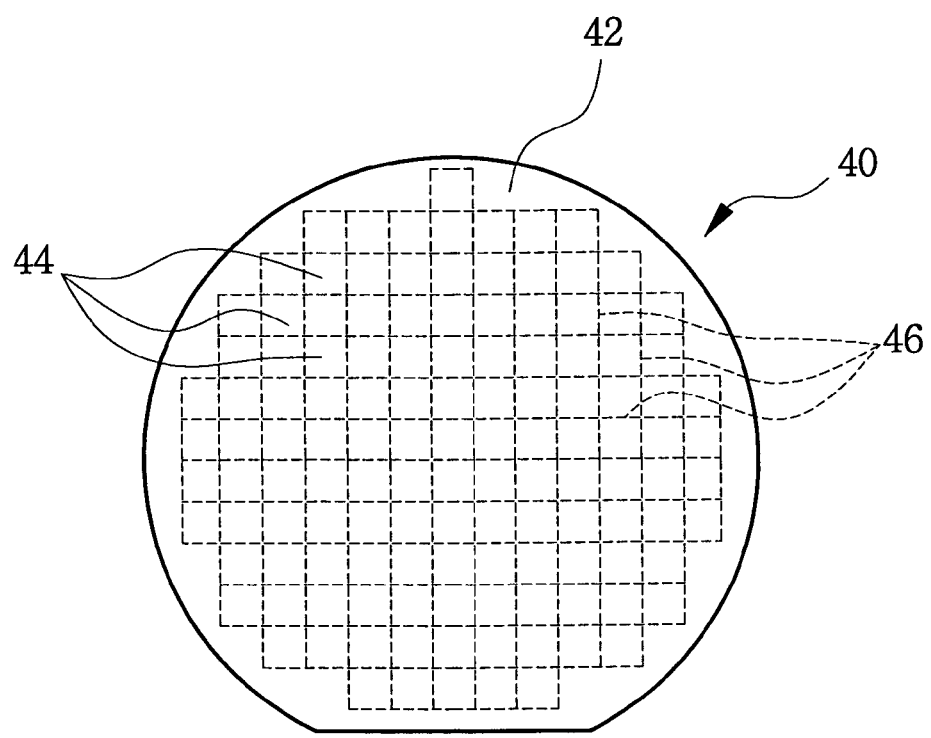

Referring to FIG. 8, a PCB disk 40 is provided which includes a nonconductive PCB substrate 42 having a plurality of PCB chip regions 44 defined between scribe lines 46. The PCB chip regions 44 coincide with the chips 34 of the silicon wafer 30 (FIG. 5), and the outer peripheral dimension of the PCB disk 40 is preferably similar to that of the silicon wafer 30. Preferably, however, the PCB disk 40 is not as thick as the silicon wafer 30. For example, in the case of an 8-inch diameter wafer, the thickness of the PCB disk 40 may be approximately 130 um.

Figure 9:
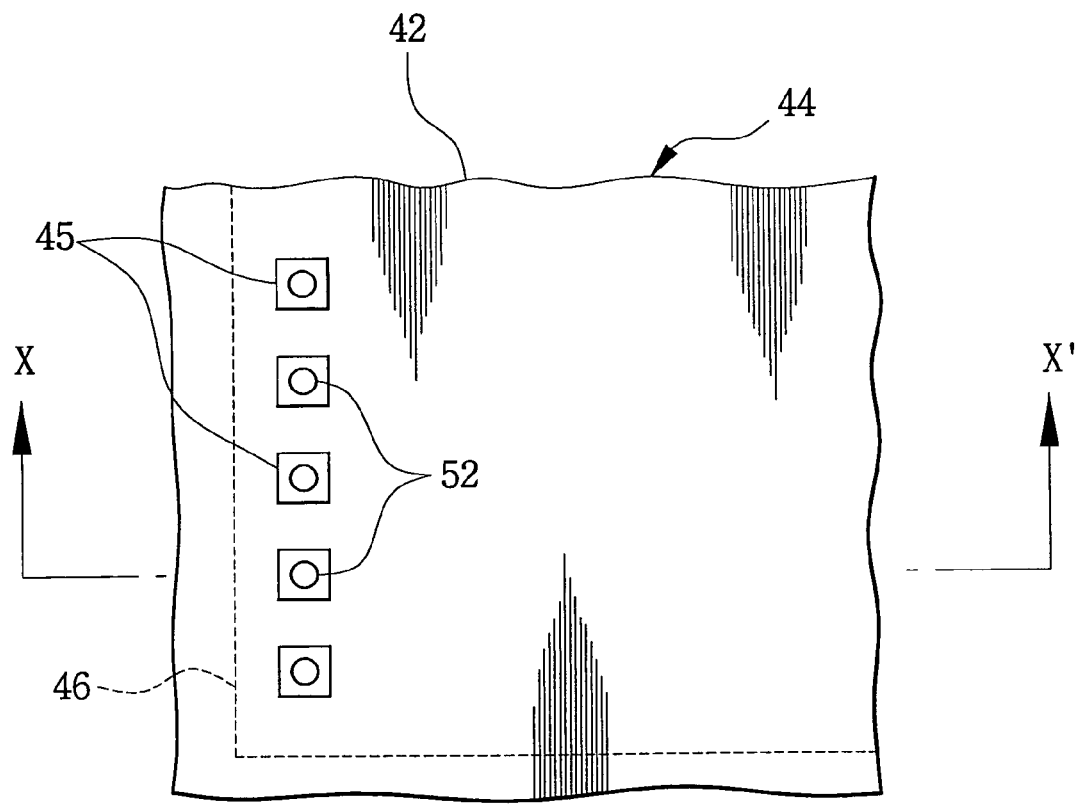
Figure 10:
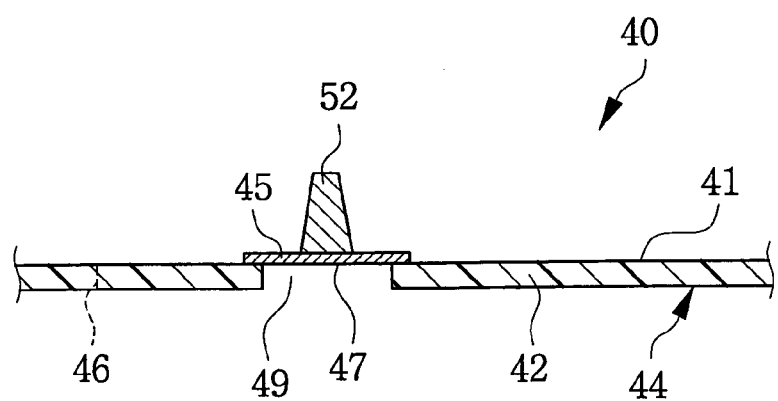

FIG. 9 shows a schematic top view of a portion of a chip region 44 of the PCB disk 40 of FIG. 8, and FIG. 10 is a cross-sectional view taken along the line X–X' of FIG. 9. Each of the PCB chip regions 44 includes a plurality of PCB pads 45 on the nonconductive PCB substrate 42. The PCB pads 45 may be formed of copper and may have a square shape when viewed from above. The PCB substrate 42 has a plurality of PCB windows 49 defined there through. Each of the PCB windows 49 exposes a bottom surface portion of the corresponding PCB pads 45. Further, a PCB bump 52 is formed on an upper surface of each PCB pad 45. The PCB bumps may be formed by depositing a layer of conductive material, preferably a copper layer, on an upper surface 41 of the PCB disk 40 and the PCB pads 45, and then by subjecting the deposited layer to a photolithography process. As shown, the PCB bumps 52 are aligned with the PCB windows 49. Also, the PCB bumps 52 and PCB pads 45 may be plated with a gold layer or a composite layer of nickel and gold.

Figure 11:
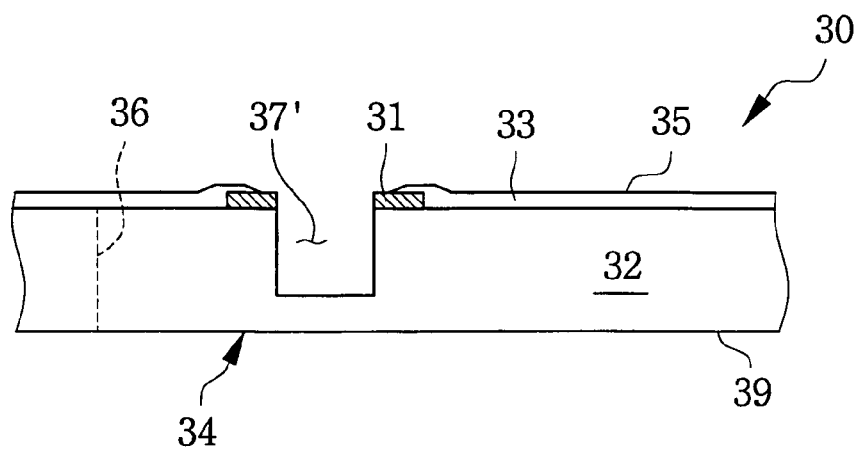
Figure 12A:
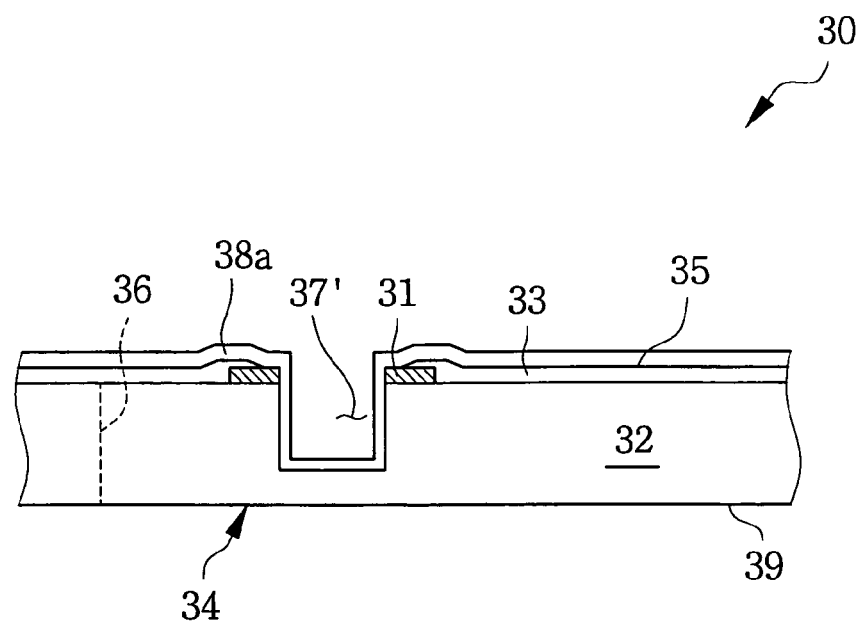
Figure 12B:
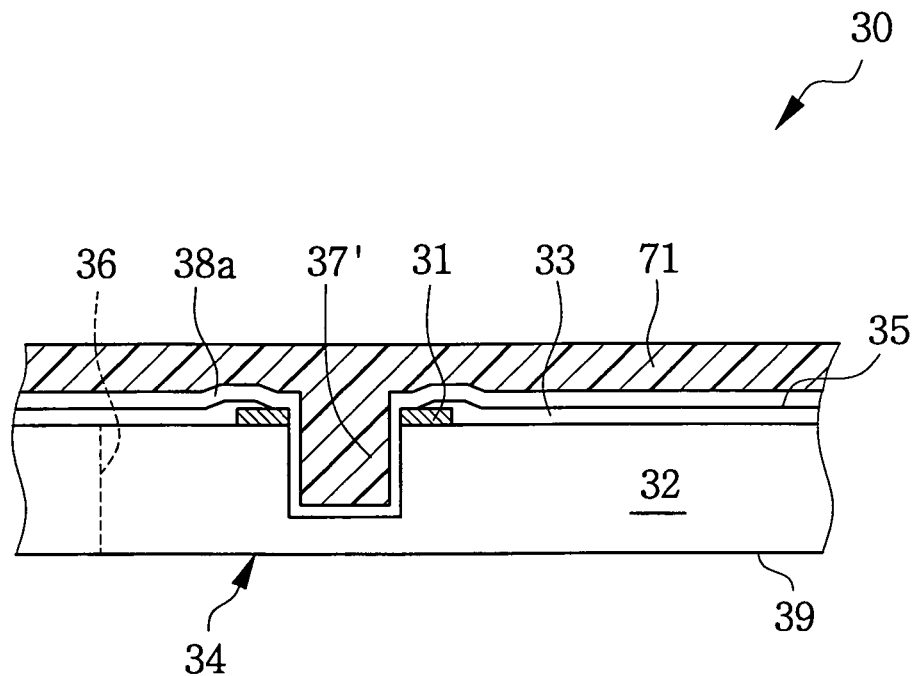
Figure 12C:
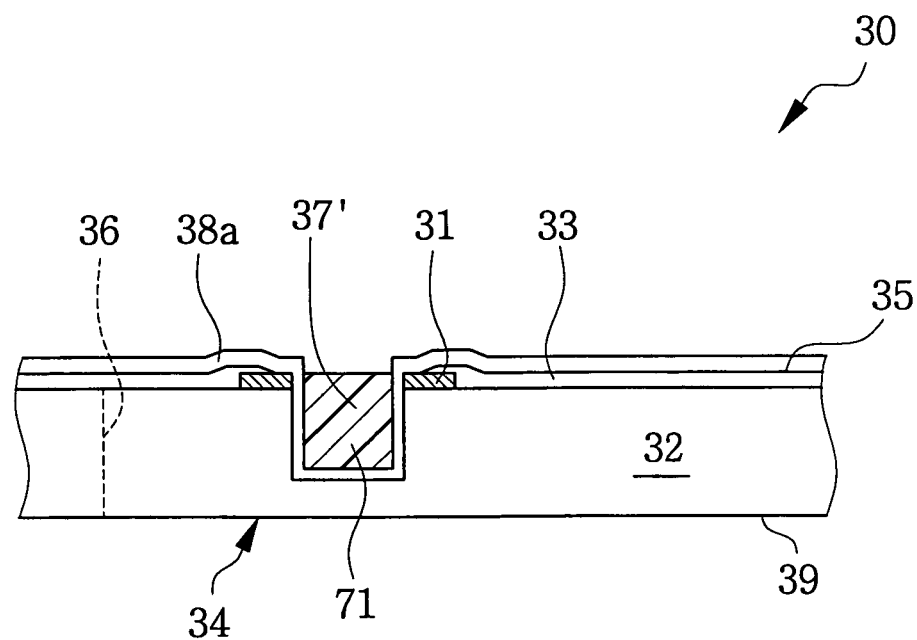
Figure 12D:
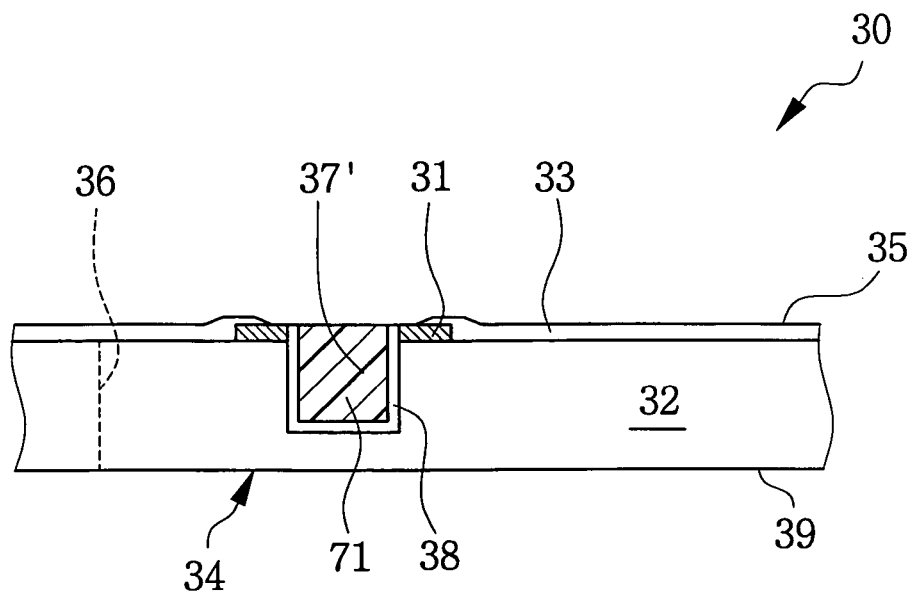
Figure 12E:
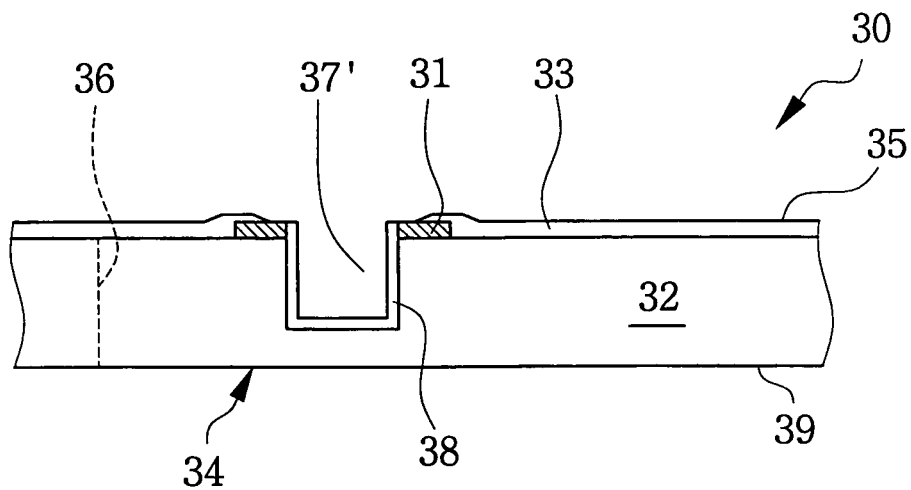
Figure 13:
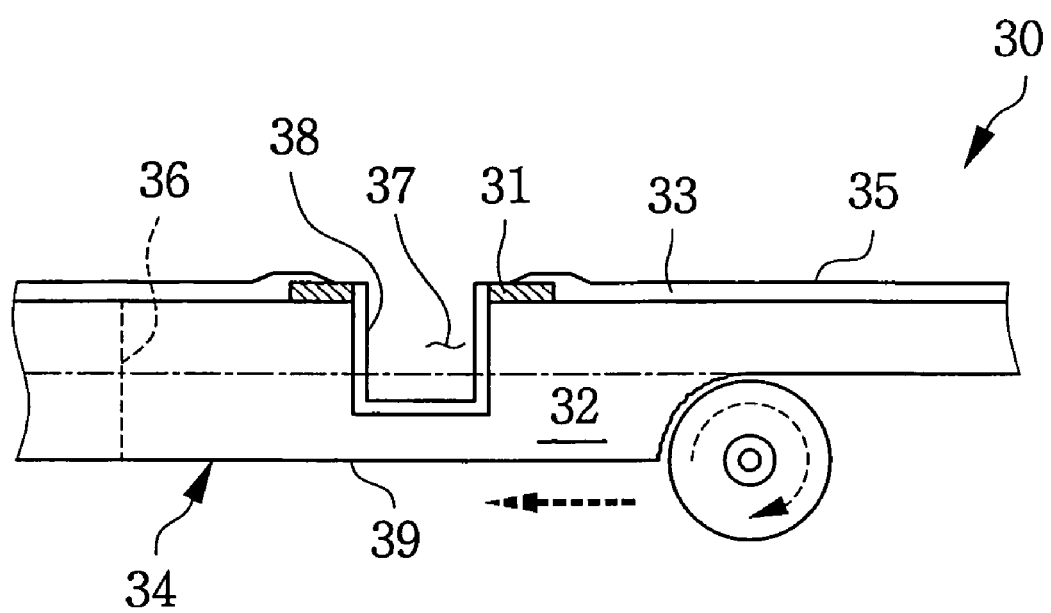

Referring to FIGS. 11 through 13, a description will now be given of the formation of through holes in the silicon wafer 30 of FIGS. 5 through 7. The through holes being formed correspond to the through holes 37 of the chip 34 shown in FIG. 4.

Referring first to FIG. 11, a plurality of trenches 37' is formed through the chip pads 31 to a depth within the structure illustrated in FIG. 7. The trenches 37' may be formed by laser drilling, dry etching or wet etching. For example, the depth of the trenches 37' may be approximately 100 um in the case of an 8-inch diameter wafer.

Referring to FIG. 12A, an isolation layer 38a is formed over the active surface 35 of the silicon wafer 30. The isolation layer 38a is preferably formed of a material having etch selectivity relative to the chip pad 31 and the passivation layer 33, such as silicon oxide, silicon nitride, or a composite thereof.

Referring to FIG. 12B, a photoresist 71 is deposited on the structure of FIG. 12A, thereby filling the trenches 37'.

Referring to FIG. 12C, the photoresist 71 is subjected to an etchback technique, such that the photoresist 71 only remains within the trenches 37'.

Referring to FIG. 12D, the isolation layer 38a is selectively etched using the photoresist 71 remaining in the trenches 37' as an etch mask.

Referring to FIG. 12E, the photoresist 71 within the trench 37' is removed.

As a result of the processes of FIGS. 12A through 12E, a structure is realized in which the sidewalls of the trenches 37' are covered with a layer of isolator 38.

Referring next to FIG. 13, an inactive surface 39 of the silicon wafer 30 is subjected to mechanical grinding to form apertures 37 which extend completely through the silicon wafer 30. For example, in the case of an 8-inch diameter wafer initially having a thickness of approximately 720 um, the thickness of the wafer 30 may be approximately 80 um after the grinding process. It is noted that the inactive surface 39 of the silicon wafer 30 may instead be subjected to chemical mechanical polishing (CMP) to form the apertures 37.

Figure 14:
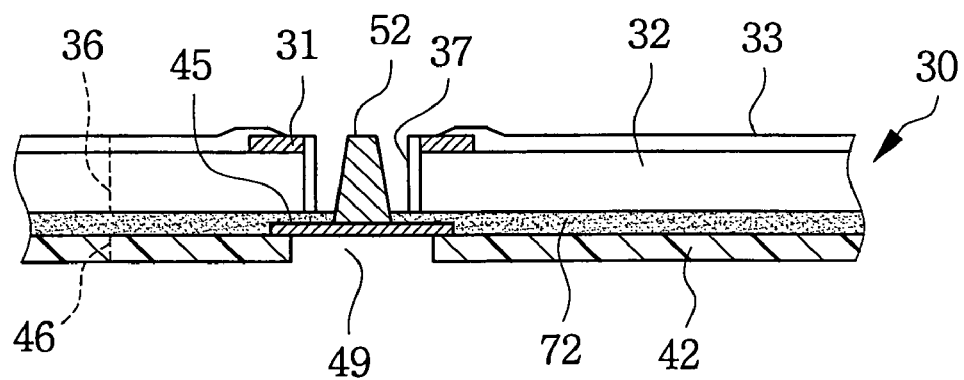
Figure 15:
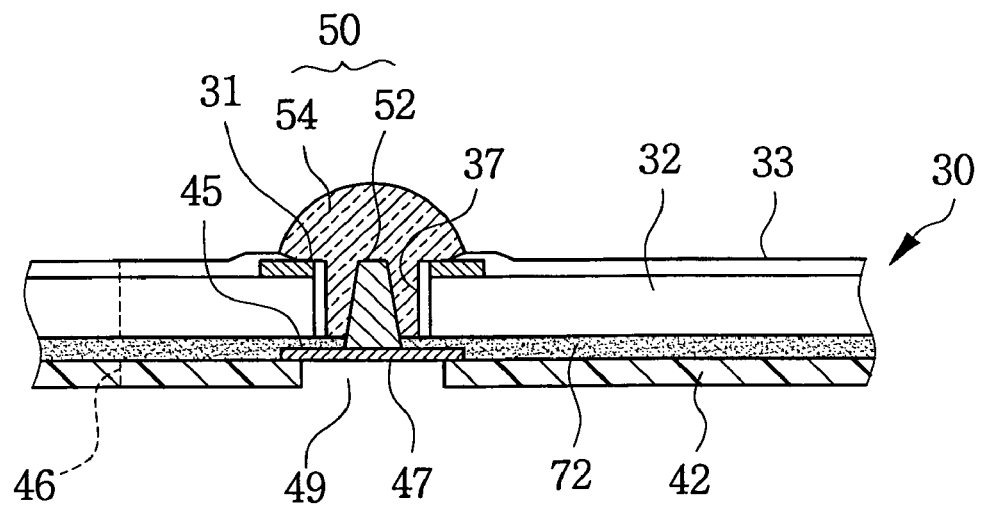
Figure 16:
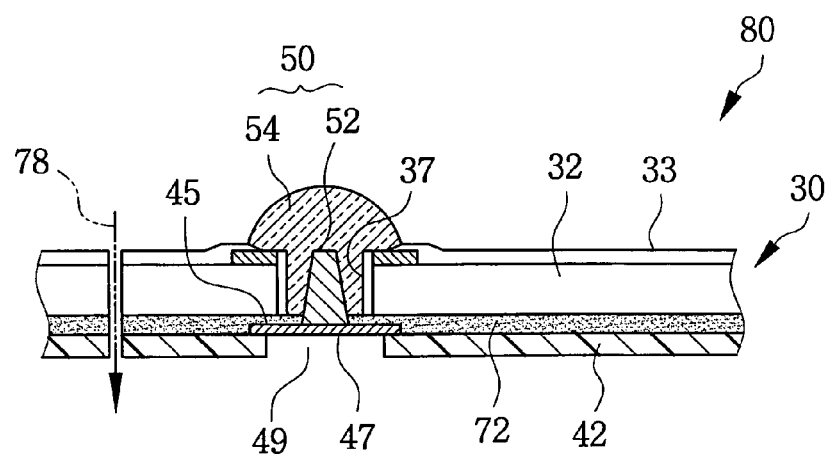

Referring next to FIGS. 14 through 16, a description will now be given of the formation of wafer level packages from the combination of the PCB disk 40 of FIGS. 8 through 10 and the silicon wafer 30 having been processed according to FIGS. 11 through 13.

Referring to FIG. 14, the silicon wafer 30 is positioned relative the PCB disk 40 so that the integrated circuit chips 34 and scribe lines 36 of the silicon wafer 30 are aligned with the PCB chip regions 44 and scribe lines of the PCB disk 40. An adhesive 72 is used to join the upper surface of PCB disk 40 to the lower inactive surface 39 of the silicon wafer 30. In this manner, PCB bumps 52 of the PCB disk 40 are inserted into the apertures 37 of the silicon wafer 30.

Referring to FIG. 15, a plurality of interconnection bumps 54 is formed so as to electrically connect the chip pad 31 to the PCB bump 52. The interconnection bumps 54 are electrically isolated from the semiconductor substrate 32 by the isolator layers 38. The interconnection bumps 54, which are preferably solder balls, can be formed by a ball placement technique, a plating technique, a stencil printing technique or a metal jet technique. In this embodiment, the interconnection bumps 54 are hemispherical solder balls formed by stencil printing and reflow. Each pair of interconnection bumps 54 and PCB bumps 52 constitutes a plug 50.

Referring to FIG. 16, the resultant structure of FIG. 15 is separated into a plurality of packages 80 at the chip scribe lines 36 and the PCB scribe lines 46 as indicated by reference number 78. External terminals, not shown, are formed on the PCB windows 49. The external terminals are preferably formed of solder balls, but may be formed of gold or nickel instead of solder. Also, the external terminals may be formed before separating the structure of FIG. 15 into the plurality of packages 80.

The package 80 is thus a composite of the integrated circuit chip 34 and the PCB chip 44, with the PCB chip 44 lying between the semiconductor integrated circuit chip 34 and the external terminals (e.g., solder balls). The external terminals of the package 80 are mounted on an external printed circuit board, and in this state, the PCB chip 44 acts as a buffer to reduce the difference in thermal expansion between the package 80 and the external printed circuit board. In this manner, the amount of potentially damaging stress applied to the external terminals is reduced.

The wafer level package 80 described above may be modified a number of different ways. For example, the PCB windows 45 need not be aligned under the PCB bumps 52, and instead can be offset a distance from the PCB bumps 52. In this case, the PCB pads may be elongated to extend from the PCB bumps 52 to the offset PCB windows 45. That is, the PCB pads 45 may be formed as strip-shaped rerouting conductive patterns.

Also, the PCB substrate can be provided without PCB windows. In this case, each PCB pad 45 would be replaced with an upper PCB pad and a lower PCB pad. The upper PCB pad would be formed on the upper surface of the PCB substrate and have the PCB bump 52 formed thereon. The lower PCB pad would be formed on the lower surface of the PCB substrate 42 and have the external terminal (e.g., solder ball) formed thereoin. If the upper and lower PCB pads are aligned with on another, than they would be electrically connected by a via hole extending through the PCB substrate 42. If the upper and lower PCB pads are not aligned with one another, than they would be electrically connected by a combination of a via hole extending through the PCB substrate 42 and a conductive pattern on a surface of the PCB substrate 42.

In another modification, the PCB disk 40 may be constituted of an adhesive tape-like medium, rather than a relatively rigid substrate.

Figure 17:
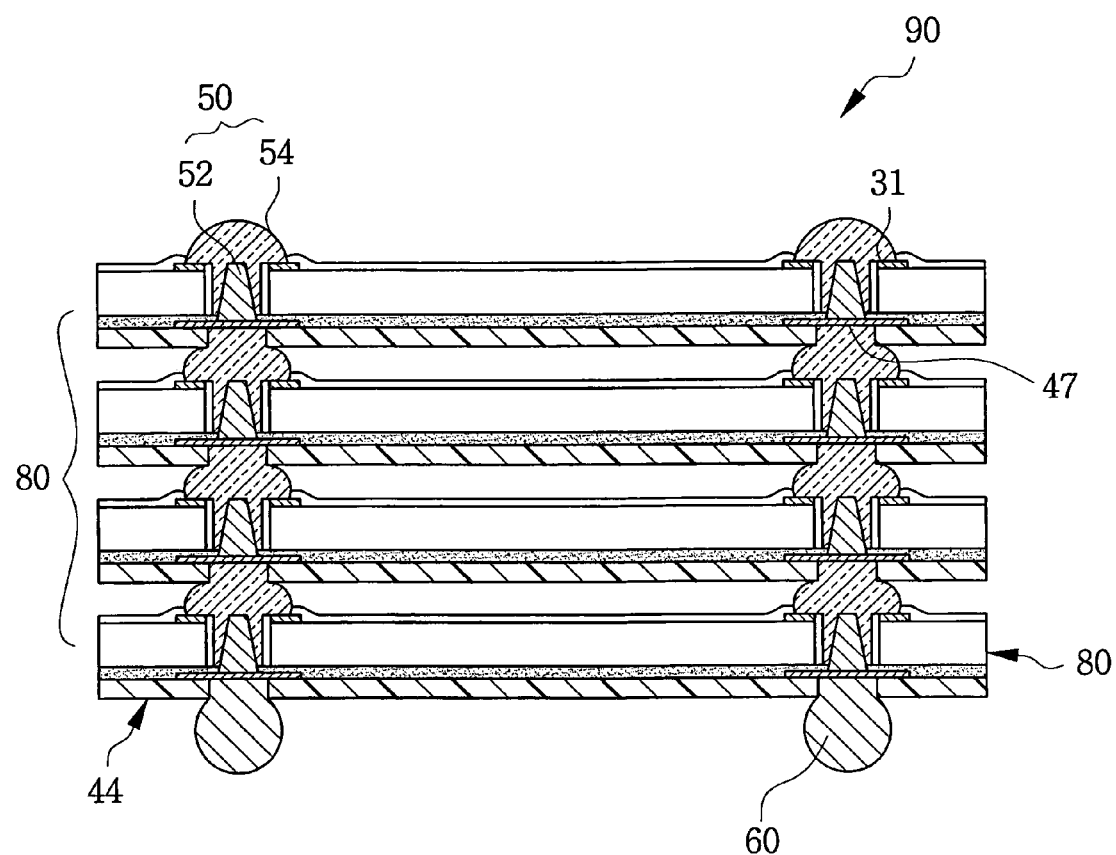
FIG. 17 is a schematic cross-sectional view illustrating a multi-package stack in accordance with an embodiment of the present invention.

FIG. 17 is a schematic cross-sectional view illustrating a multi-package stack 90 according to an embodiment of the present invention. As shown, the multi-package stack 90 includes multiple wafer level packages 80 stacked over one another. Each wafer level package 80 corresponds to the wafer level package shown in FIG. 4 and described above.

In this embodiment, the solder of the conductive plug 50 of each wafer level package 80 is connected to the PCB pad and through the window 47 of an upper wafer level package 80 in the stack 90.

External terminals 60 are formed on the bottom surface of the PCB pad and through the window 47 of the bottommost package 80 of the stack 90. The external terminals 60 are preferably formed of solder balls, but may be formed of gold or nickel instead of solder. The external terminals 60 of the stack 90 are mounted on an external printed circuit board (not shown), and in this state, the PCB chip 44 of the bottommost package 80 acts as a buffer to reduce the difference in thermal expansion between the stack 90 and the external printed circuit board. In this manner, the amount of potentially damaging stress applied to the external terminals 60 is reduced.

Figure 18:
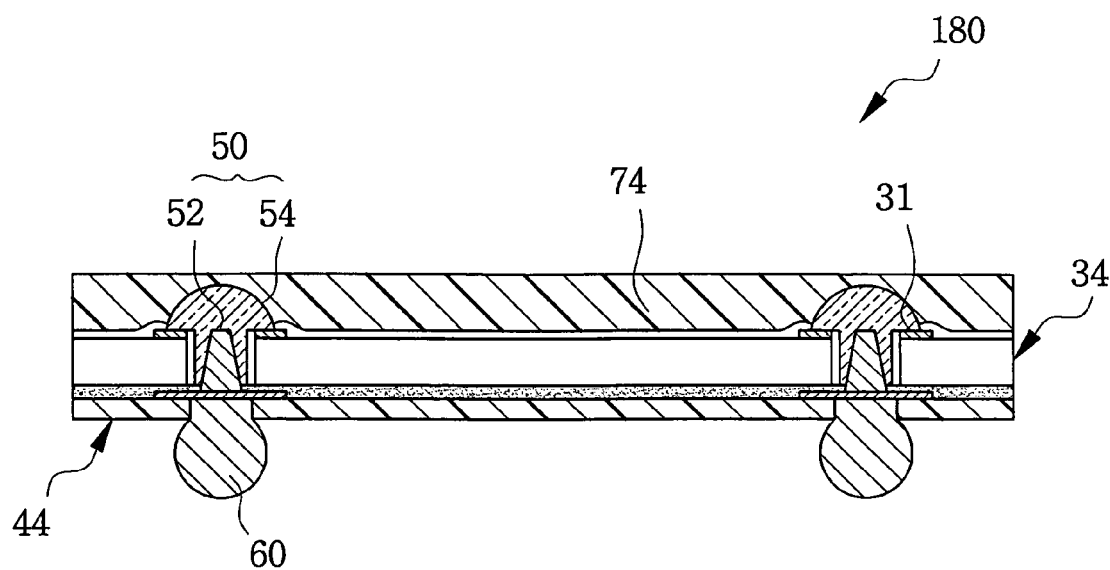
FIG. 18 is a schematic cross-sectional view illustrating a wafer level package in accordance with another embodiment of the present invention.
Figure 19:
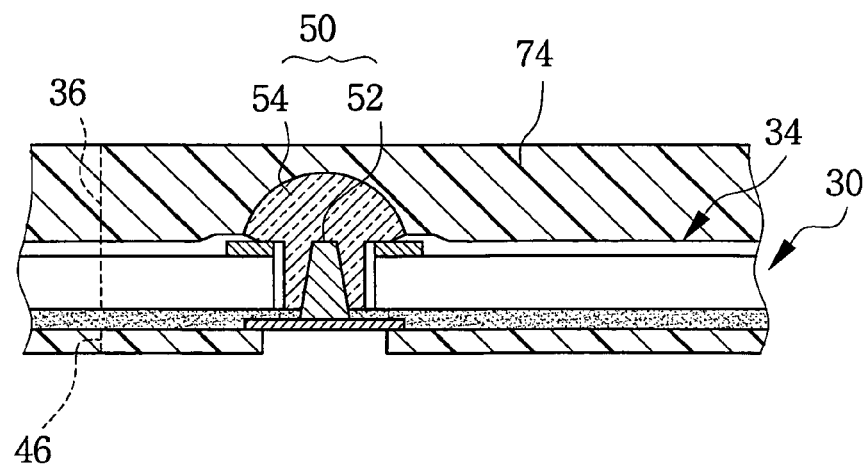
FIGS. 19 through 21 are diagrams for explaining successive process steps in the formation of the wafer level package of FIG. 18.
Figure 20:
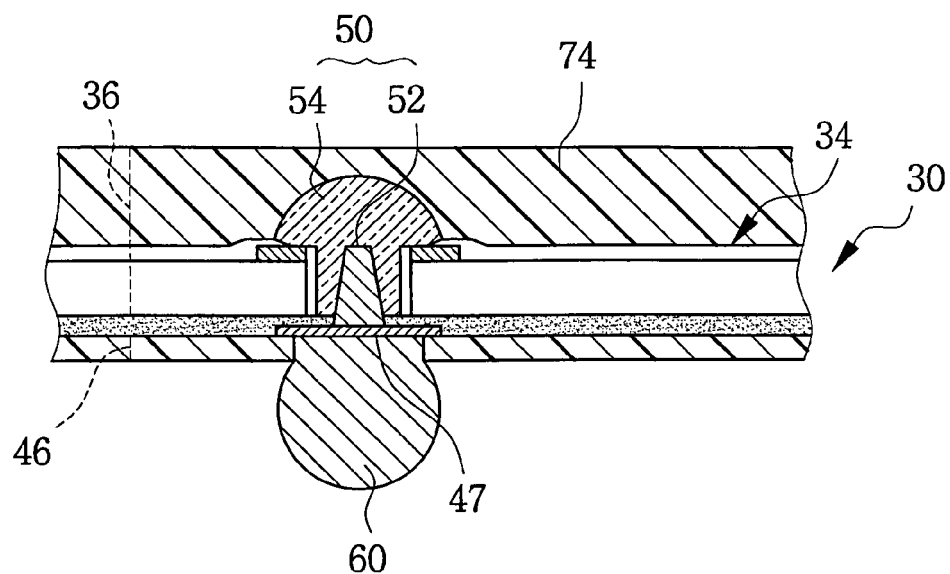

FIGS. 18 through 20 are schematic cross-sectional views illustrating another embodiment of the present invention. This embodiment is substantially the same as previous embodiments, except for the formation of the protection layer 74 shown in FIG. 18.

That is, referring first to FIG. 19, the protection layer 74 of a liquid type resin is formed on an active surface of the chip 34 of the structure shown and described previously with reference to FIG. 15. The liquid type resin can be applied by a transfer molding technique, an injection molding technique, a screen printing technique or a dispensing technique.

Figure 21:
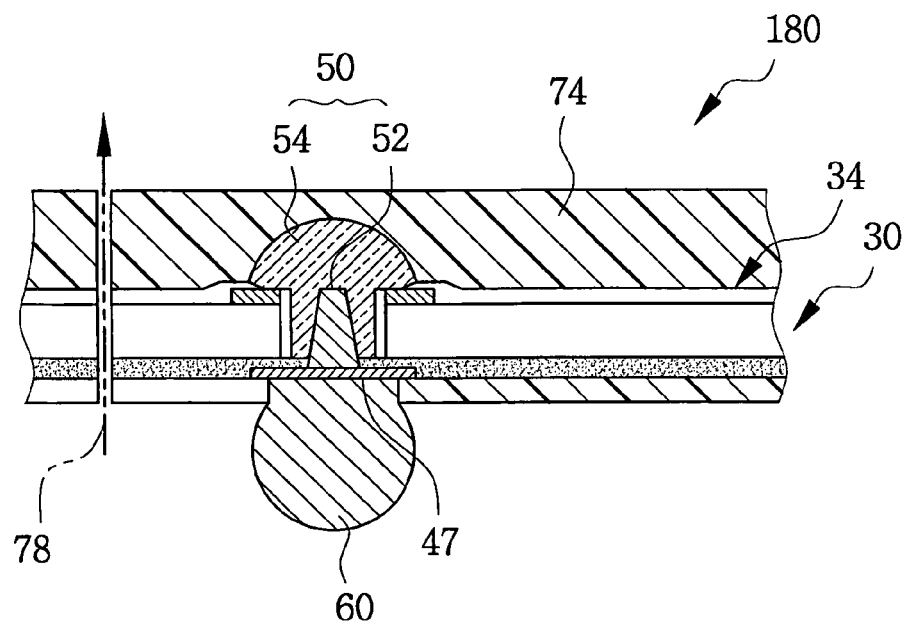

Referring to FIGS. 20 and 21, external terminals 60 are formed on the bottom surface of the PCB in the same manner as described previously, and the resultant structure is separated into a plurality of packages 80 as represented by reference number 78 of FIG. 21. It is noted that the external terminals 60 can be mounted after separation of the packages 80.

After separation, the structure of FIG. 18 is obtained. The protection layer 74 thereof functions to protect the active surface of the semiconductor chip 34 from the external environment.

Figure 22:
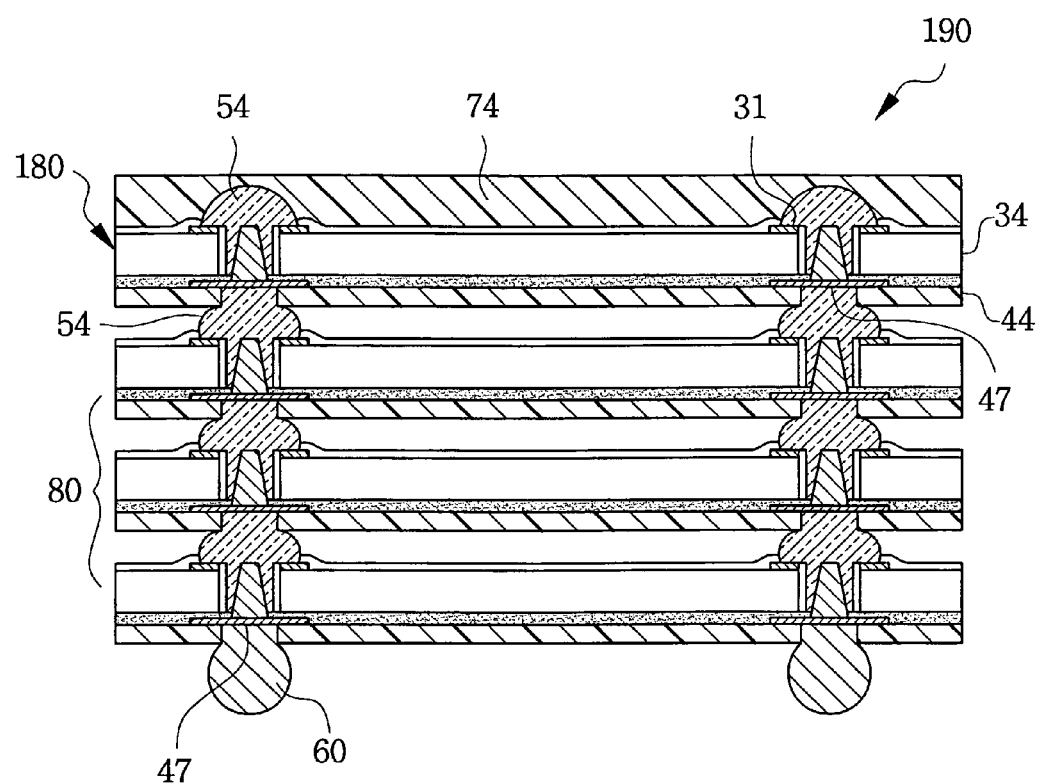
FIG. 22 is a schematic cross-sectional view illustrating a multi-package stack in accordance with another embodiment of the present invention.
Figure 23:
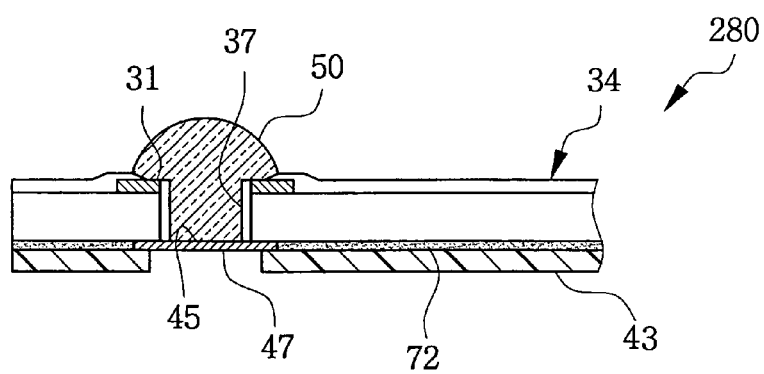
FIGS. 23 through 26 are schematic cross-sectional views illustrating wafer level packages and multi-package stacks in accordance with another embodiment of the present invention.
Figure 24:
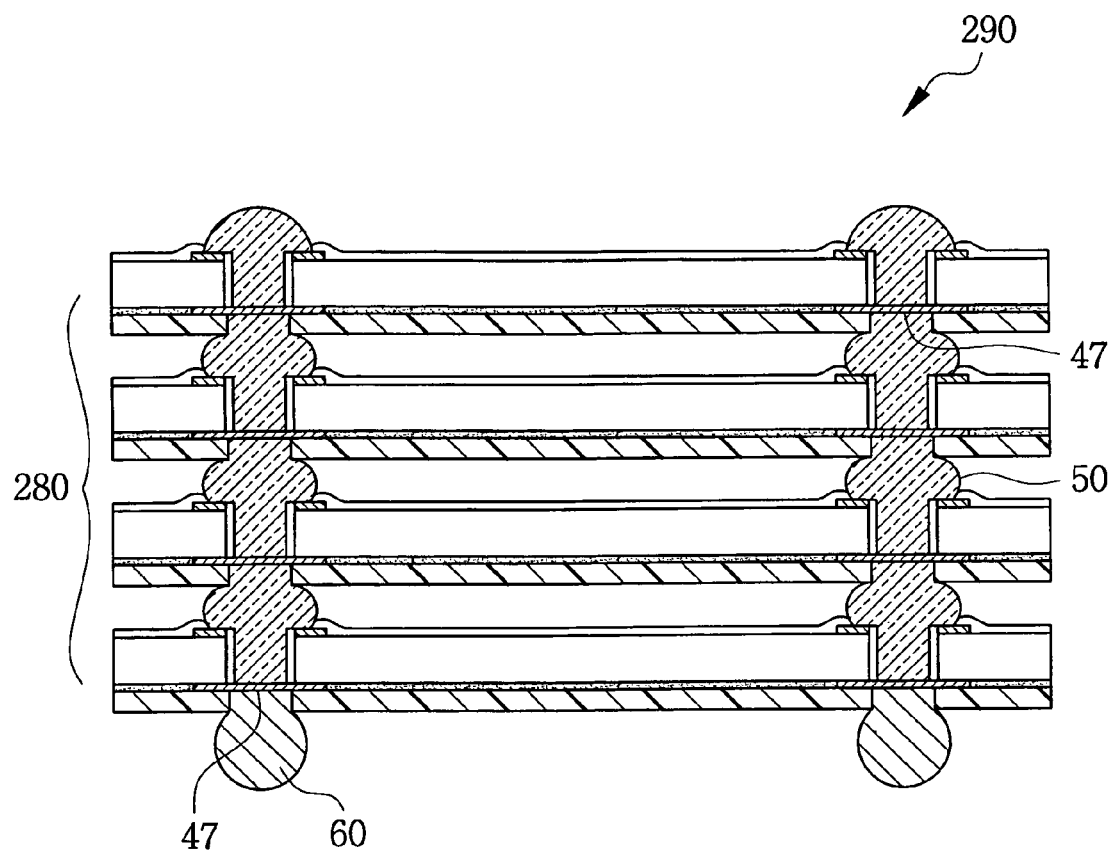
Figure 25:
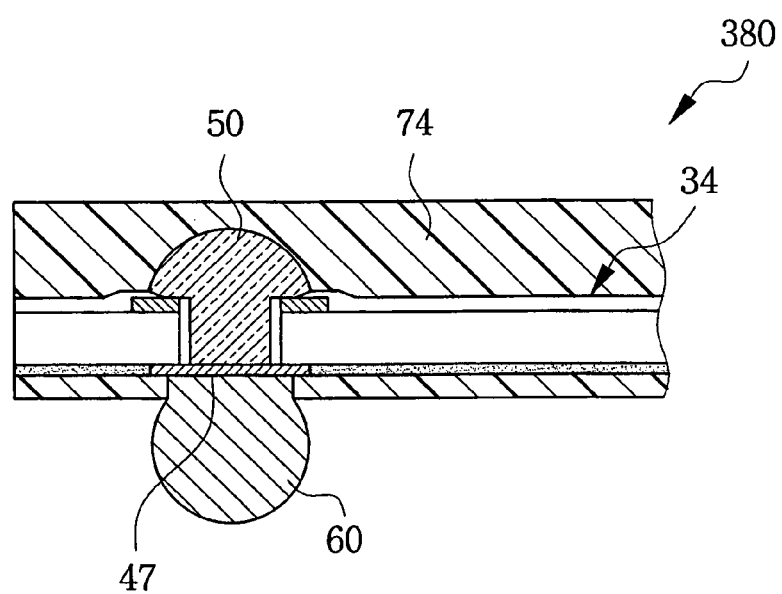
Figure 26:
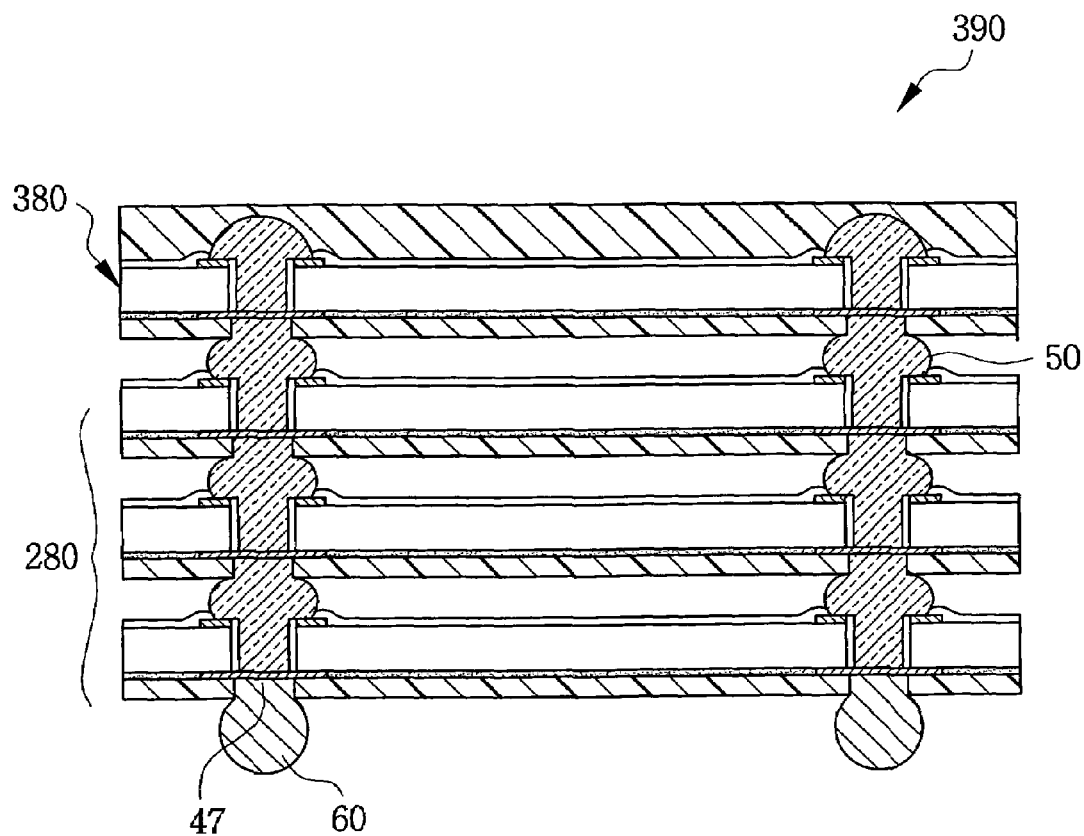
Figure 27:
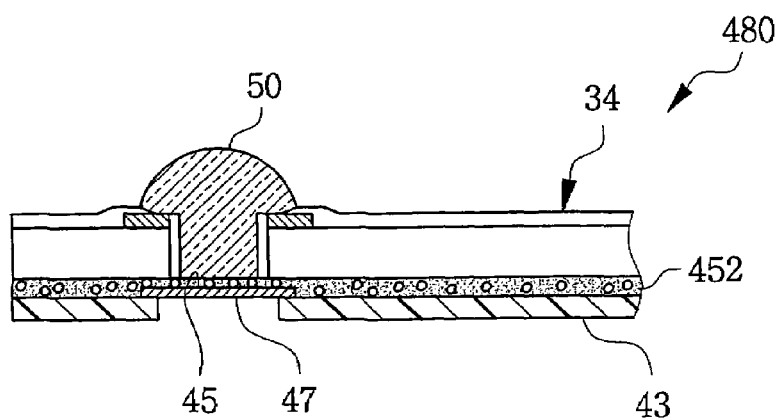
FIGS. 27 through 30 are schematic cross-sectional views illustrating wafer level packages and multi-package stacks in accordance with another embodiment of the present invention.
Figure 28:
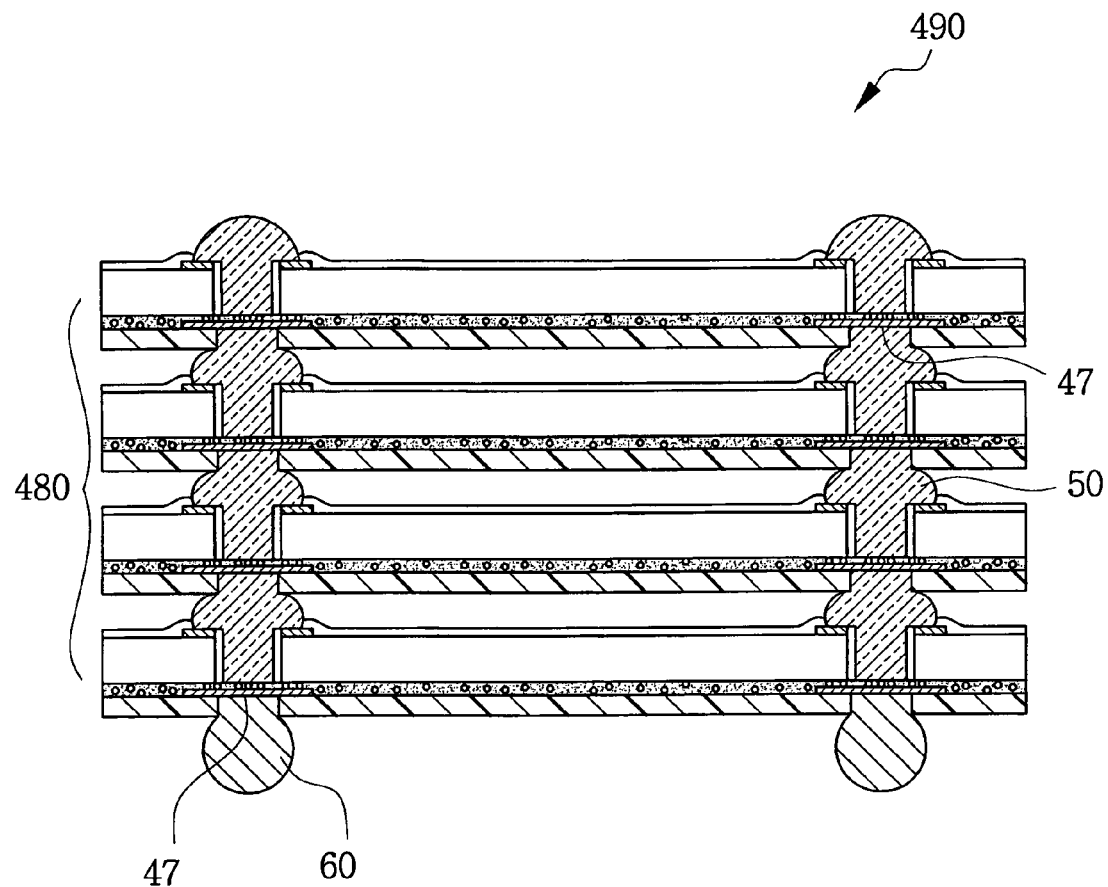
Figure 29:
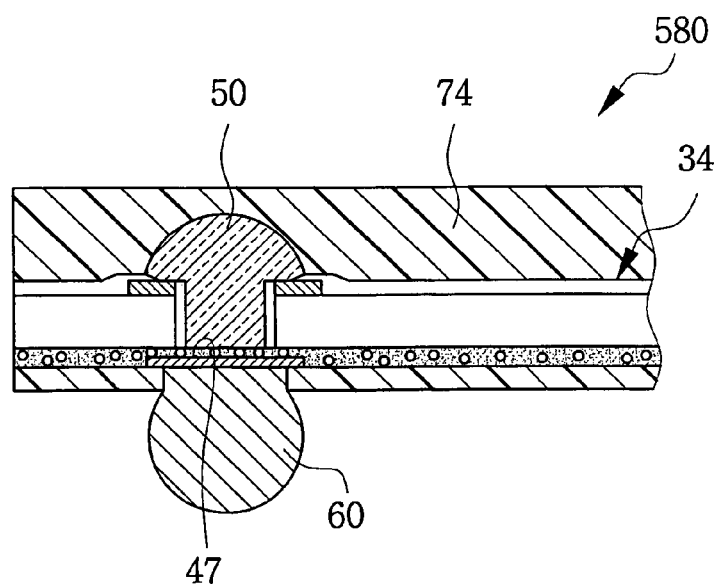
Figure 30:
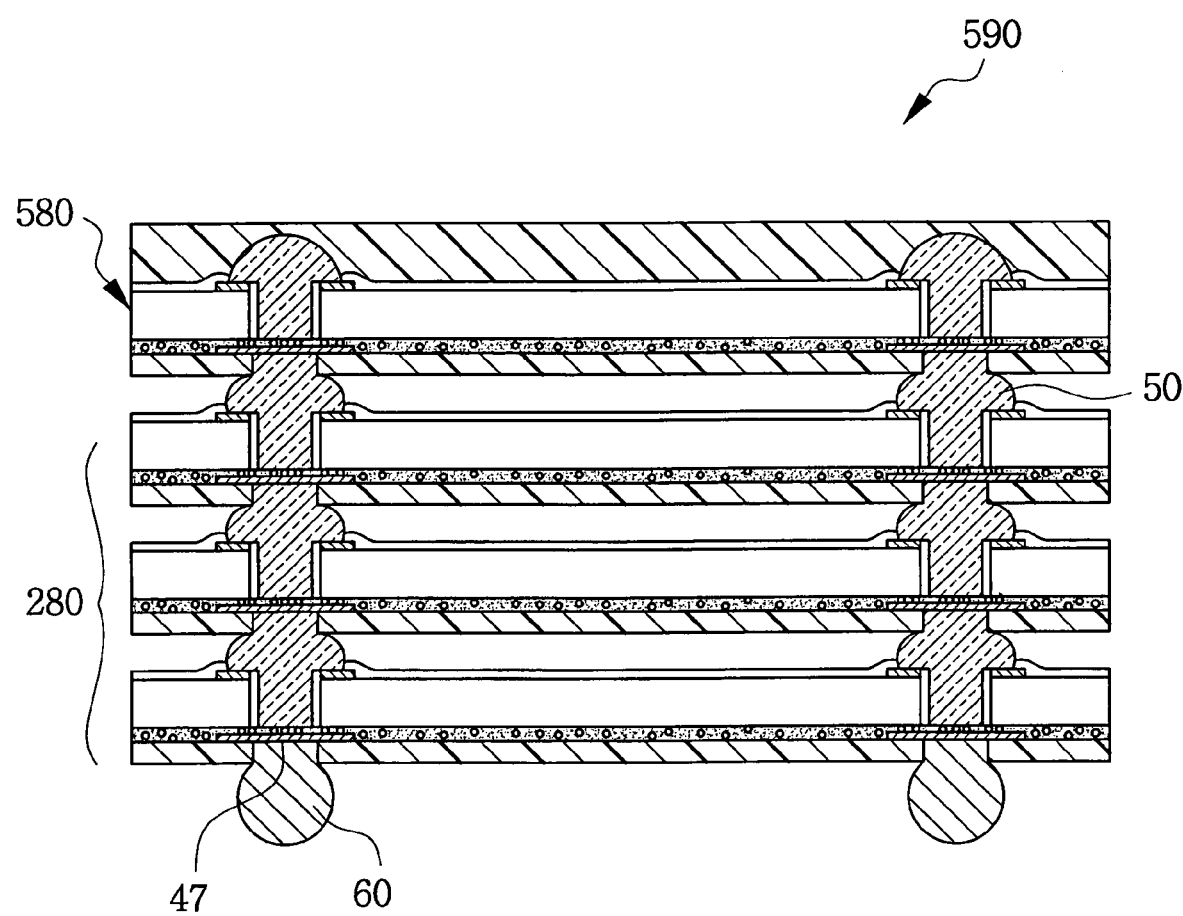

FIG. 22 is a schematic cross-sectional view illustrating a multi-package stack 190 according to another embodiment of the present invention. This embodiment differs from the previously described stack of FIG. 17 in that the uppermost package 180 of this embodiment includes the protection layer 74 of FIG. 18.

FIGS. 23, 24, 25 and 26 are schematic cross-sectional views illustrating another modified embodiment of the present invention. FIGS. 23, 24, 25 and 26 differ from previously describe FIGS. 16, 17, 21 and 22, respectively, only in that there are no PCB bumps in this modified embodiment.

FIGS. 27, 28, 29 and 30 are schematic cross-sectional views illustrating another embodiment of the present invention. FIGS. 27, 28, 29 and 30 differ from previously described FIGS. 23, 24, 25 and 26, respectively, only in that the joining of the PCB chips 44 and the integrated circuit chips 34 is achieved by an anisotropic conductive film (ACF) ACF 452. This film is characterized by being conductive in a direction perpendicular to its surface and non-conductive in a direction parallel to its surface. Thus, the ACF 452 may be applied over an entire bottom surface of the chip or over an entire upper surface of the PCB. This embodiment has an advantage in that is not necessary to pattern the adhesive 72 of previous embodiments.

Figure 31:
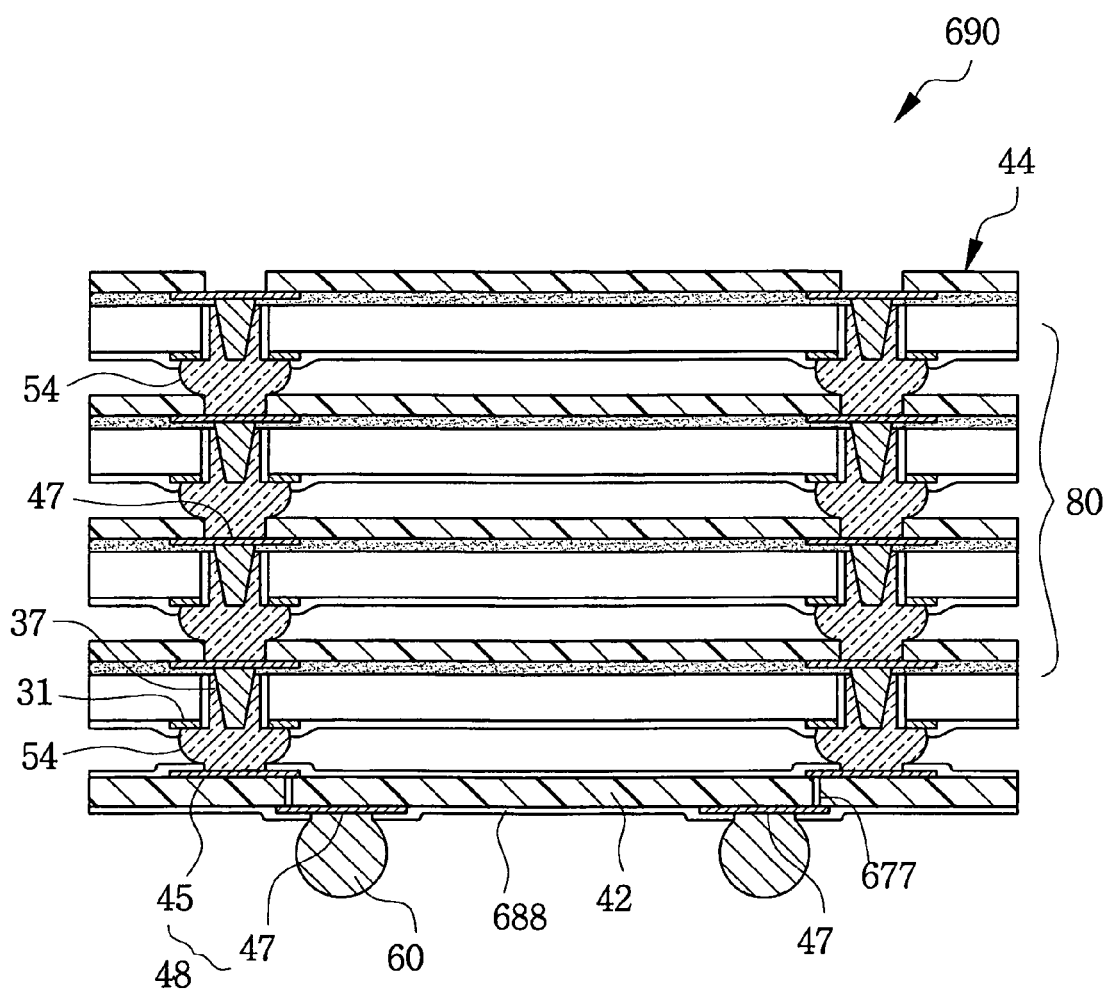
FIG. 31 is a schematic cross-sectional view illustrating a multi-package stack in accordance with another embodiment of the present invention.

FIG. 31 is a schematic cross-sectional view illustrating a multi-package stack 690 according to another embodiment of the present invention. This embodiment is characterized by at least two of the packages 80 turned upside down when comparee to earlier embodiments. Further, the interconnection bumps 54 of the bottommost package 80 are connected to a rerouting PCB chip 44. The rerouting PCB chip 44 includes PCB pads 48 each defined by an upper PCB pad 45 and a lower PCB pad 47. The upper PCB pad 45 and the lower PCB pad 47 are formed on the upper and the lower surfaces of a PCB substrate 42, respectively. The external terminals 60 are formed on the lower PCB pads 47. The upper PCB pads 45 are aligned with apertures 37 of the bottommost package 80, while the lower PCB pads 47 are not aligned with the apertures 37. Each set of the upper PCB pad 45 and the lower PCB pad 47 is electrically connected by signal vias 677 formed through the PCB substrate 42. The upper PCB pad 45, the lower PCB pad 47 and the signal vias 677 constitute a rerouting conductive pattern. A solder resist layer 688 may be formed on the upper and lower surfaces of the PCB substrate 42, respectively.

The external terminals 60 of the stack 690 are mounted on an external printed circuit board (not shown), and in this state, the rerouting PCB chip 44 at the bottom of the stack acts as a buffer to reduce the difference in thermal expansion between the stack 690 and the external printed circuit board. In this manner, the amount of potentially damaging stress applied to the external terminals 60 is reduced.

In the drawings and specification, there have been disclosed typical preferred embodiments of this invention and, although specific examples are set forth, they are used in a generic and descriptive sense only and not for purposes of limitation. It should be understood the scope of the present invention is to be construed by the appended claims, and not by the exemplary embodiments.

What is claimed is:

1. A semiconductor chip package, comprising:
    a semiconductor chip which includes a through hole extending there through from an active first surface to an inactive second surface;
    a first conductive pad which at least partially surrounds the through hole on the active first surface of the semiconductor chip;
    a printed circuit board which includes a first surface attached to the inactive second surface of the semiconductor chip, and which further includes a second conductive pad aligned with the through hole of the semiconductor chip; and
    a conductive material which fills the through hole and directly contacts the first and second conductive pads.

2. A semiconductor chip package as claimed in claim 1, wherein the conductive material comprises solder.

3. A semiconductor chip package as claimed in claim 2, wherein the solder forms a solder bump over the active first surface of the semiconductor chip.

4. A semiconductor chip package as claimed in claim 1, wherein the printed circuit board includes an aperture aligned below the second conductive pad opposite the through hole.

5. A semiconductor chip package as claimed in claim 4, further comprising an electrode which is electrically connected to the second conductive pad and which protrudes through the aperture in the printed circuit board.

6. A semiconductor chip package as claimed in claim 5, wherein the electrode is a solder ball.

7. A semiconductor chip package as claimed in claim 1, further comprising an electrode which is electrically connected the second conductive pad and which is attached to a second surface of the printed circuit board opposite the first surface of the printed circuit board.

8. A semiconductor chip package as claimed in claim 7, wherein the electrode is a solder ball.

9. A semiconductor chip package as claimed in claim 1, further comprising an insulating layer located on sidewalls of the through hole of the semiconductor chip.

10. A semiconductor chip package as claimed in claim 1, further comprising an adhesive layer interposed between the inactive second surface of the semiconductor chip and the first surface of the printed circuit board.

11. A semiconductor chip package as claimed in claim 1, further comprising an anisotropic conductive film interposed between the inactive second surface of the semiconductor chip and the first surface of the printed circuit board.

12. A semiconductor chip package as claimed in claim 1, further comprising a protective layer covering the active first surface of the semiconductor chip.

13. A semiconductor chip package, comprising:
  a semiconductor chip which includes a through hole extending there through from an active first surface to an inactive second surface;
  a first conductive pad which at least partially surrounds the through hole on the active first surface of the semiconductor chip;
  a printed circuit board which includes a first surface attached to the inactive second surface of the semiconductor chip, and which further includes a second conductive pad aligned with the through hole of the semiconductor chip; and
  a conductive material which fills the through hole and contacts the first and second conductive pads;
  wherein the conductive material comprises a metal plug which protrudes into the through hole from the second conductive pad of the printed circuit board, and solder which surrounds the metal plug.

14. A semiconductor chip package as claimed in claim 13, wherein the solder forms a solder bump over the active first surface of the semiconductor chip.

15. A semiconductor multi-package stack, comprising:
  a plurality of stacked semiconductor chip packages, each chip package comprising (a) a semiconductor chip which includes a through hole extending there through from an active first surface to an inactive second surface, (b) a first conductive pad which at least partially surrounds the through hole on the active first surface of the semiconductor chip, (c) a printed circuit board which includes a first surface attached to the second surface of the semiconductor chip, and a second conductive pad which is aligned with the through hole of the semiconductor chip, and (d) a conductive material which fills the through hole and contacts the first and second conductive pads.

16. A semiconductor multi-package stack as claimed in claim 15, wherein the semiconductor chip packages are stacked such that the conductive material of a lower chip package contacts the printed circuit board of an adjacent upper chip package.

17. A semiconductor multi-package stack as claimed in claim 16, wherein the conductive material of each semiconductor chip package comprises solder.

18. A semiconductor multi-package stack as claimed in claim 17, wherein the solder forms a solder bump over the active first surface of the semiconductor chip of each semiconductor chip package.

19. A semiconductor multi-package stack as claimed in claim 16, wherein the printed circuit board of each semiconductor chip package includes an aperture aligned below the second conductive pad opposite the through hole, and wherein the conductive material of the lower chip package contacts the second conductive pad of the printed circuit board of the adjacent upper chip package through the aperture of the adjacent upper chip package.

20. A semiconductor multi-package stack as claimed in claim 16, further comprising an electrode which is electrically connected to the second conductive pad a lowermost semiconductor chip package and which protrudes through the aperture in the printed circuit board of the lowermost semiconductor chip package.

21. A semiconductor multi-package stack as claimed in claim 16, wherein the electrode is a solder ball.

22. A semiconductor multi-package stack as claimed in claim 16, further comprising an electrode which is electrically connected the second conductive pad of the lowermost semiconductor chip package of the and which is attached to a second surface of the printed circuit board opposite the first surface of the printed circuit board.

23. A semiconductor multi-package stack as claimed in claim 22, wherein the electrode is a solder ball.

24. A semiconductor chip package as claimed in claim 16, further comprising an insulating layer located on sidewalls of the through hole of the semiconductor chip of each semiconductor chip package.

25. A semiconductor chip package as claimed in claim 16, further comprising an adhesive layer interposed between the inactive second surface of the semiconductor chip and the first surface of the printed circuit board of each semiconductor chip package.

26. A semiconductor chip package as claimed in claim 16, further comprising an anisotropic conductive film interposed between the inactive second surface of the semiconductor chip and the first surface of the printed circuit board of each semiconductor chip package.

27. A semiconductor chip package as claimed in claim 16, further comprising a protective layer covering the active first surface of the semiconductor chip of an uppermost semiconductor chip package.

28. A semiconductor multi-package stack as claimed in claim 15, wherein the semiconductor chip packages are stacked such that the conductive material of an upper chip package contacts the printed circuit board of an adjacent lower chip package.

29. A semiconductor multi-package stack, comprising a plurality of stacked semiconductor chip packages, each chip package comprising (a) a semiconductor chip which includes a through hole extending there through from an active first surface to an inactive second surface, (b) a first conductive pad which at least partially surrounds the through hole on the active first surface of the semiconductor chip, (c) a printed circuit board which includes a first surface attached to the second surface of the semiconductor chip, and a second conductive pad which is aligned with the through hole of the semiconductor chip, and (d) a conductive material which fills the through hole and contacts the first and second conductive pads;

wherein the semiconductor chip packages are stacked such that the conductive material of a lower chip package contacts the printed circuit board of an adjacent upper chip package, and wherein the conductive material of each semiconductor chip package comprises a metal plug which protrudes into the through hole from the second conductive pad of the printed circuit board, and solder which surrounds the metal plug.

30. A semiconductor multi-package stack as claimed in claim 29, wherein the solder forms a solder bump over the active first surface of the semiconductor chip of each semiconductor chip package.

31. A semiconductor multi-package stack, comprising a plurality of stacked semiconductor chip packages, each chip package comprising (a) a semiconductor chip which includes a through hole extending there through from an active first surface to an inactive second surface, (b) a first conductive pad which at least partially surrounds the through hole on the active first surface of the semiconductor chip, (c) a printed circuit board which includes a first surface attached to the second surface of the semiconductor chip, and a second conductive pad which is aligned with the through hole of the semiconductor chip, and (d) a conductive material which fills the through hole and contacts the first and second conductive pads;

wherein the semiconductor chip packages are stacked such that the conductive material of an upper chip package contacts the printed circuit board of an adjacent lower chip package; and further comprising an external printed circuit board having a first conductive pad formed on a first surface and a second conductive pad formed on an opposite second surface, and further having an external electrode attached to the second conductive pad, wherein the conductive material of the bottommost semiconductor chip package is attached to the first conductive pad of the external printed circuit board, and wherein the first and second conductive pads of the external printed circuit board are electrically connected.

32. A semiconductor multi-package stack as claimed in claim 31, wherein the external electrode is a solder ball.

33. A semiconductor chip package, comprising:

a semiconductor chip which includes a through hole extending there through from an active first surface to an inactive second surface;

a first conductive pad which at least partially surrounds the through hole on the active first surface of the semiconductor chip;

a printed circuit board which includes a first surface attached to the inactive second surface of the semiconductor chip, and which further includes a second conductive pad aligned with the through hole of the semiconductor chip; and a conductive material which fills the through hole and contacts the first and second conductive pads;

wherein the printed circuit board includes an aperture aligned below the second conductive pad opposite the through hole.

34. A semiconductor chip package as claimed in claim 33, further comprising an electrode which is electrically connected to the second conductive pad and which protrudes through the aperture in the printed circuit board.

35. A semiconductor chip package as claimed in claim 34, wherein the electrode is a solder ball.

* * * * *